(12) United States Patent  
Freytag et al.

(10) Patent No.: US 7,397,246 B2
(45) Date of Patent: Jul. 8, 2008

(54) ELECTRICALLY SYMMETRIC NMR COILS WITH A PLURALITY OF WINDINGS CONNECTED IN SERIES

(75) Inventors: Nicolas Freytag, Binz (CH); Daniel Marek, Moeriken (CH); Alia Hassan, Binz (CH); Stephan Graf, Zurich (CH); Peter Scheuzger, Schwerzenbach (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/540,577

(22) Filed: Oct. 2, 2006

(65) Prior Publication Data
US 2007/0159170 A1 Jul. 12, 2007

(30) Foreign Application Priority Data
Oct. 6, 2005 (DE) ............ 10 2005 047 883

(51) Int. Cl.
*G01V 3/00* (2006.01)
(52) U.S. Cl. .................................................. 324/318
(58) Field of Classification Search ......... 324/300–322; 600/410–435; 333/219–235; 343/725–730, 343/741–744, 824, 850–872, 893
See application file for complete search history.

(56) References Cited

U.S. PATENT DOCUMENTS

| 4,398,149 | A |   | 8/1983 | Zens |
|---|---|---|---|---|
| 4,739,269 | A |   | 4/1988 | Kopp |
| 5,329,233 | A | * | 7/1994 | Hayes .................... 324/318 |
| 5,489,847 | A | * | 2/1996 | Nabeshima et al. ......... 324/318 |
| 5,682,098 | A | * | 10/1997 | Vij ........................ 324/318 |
| 5,929,639 | A | * | 7/1999 | Doty ...................... 324/318 |
| 6,060,882 | A | * | 5/2000 | Doty ...................... 324/318 |
| 6,150,816 | A | * | 11/2000 | Srinivasan ................ 324/318 |
| 6,175,237 | B1 |   | 1/2001 | Doty |
| 6,201,392 | B1 |   | 3/2001 | Anderson |
| 6,249,121 | B1 | * | 6/2001 | Boskamp et al. ........... 324/318 |
| 6,876,200 | B2 | * | 4/2005 | Anderson et al. .......... 324/318 |
| 2006/0164088 | A1 | * | 7/2006 | Hawkes .................... 324/321 |

FOREIGN PATENT DOCUMENTS

WO    WO 96/03661    2/1996

* cited by examiner

*Primary Examiner*—Brij B Shrivastav
*Assistant Examiner*—Dixomara Vargas
(74) *Attorney, Agent, or Firm*—Paul Vincent

(57) ABSTRACT

A nuclear magnetic resonance probe head comprising at least two orthogonal coil/resonator configurations A1 and A2 having different resonance frequencies, wherein at feast one of the coil/resonator configurations A1 has two saddle-shaped coils S1 and S2, wherein each coil has a window about which N windings are disposed which are connected in series, wherein N≧2. Each coil S1 and S2 is formed mirror-symmetrically relative to a central plane of the respective coil, which is perpendicular to the window of the respective coil, wherein the central planes of the coils S1 and S2 are identical to minimize the electromagnetic coupling between the two coil/resonator configurations A1 and A2 at the resonance frequency of A2. The NMR probe head reduces coupling between the two coil/resonator configurations.

14 Claims, 5 Drawing Sheets

Fig. 3a: PRIOR ART

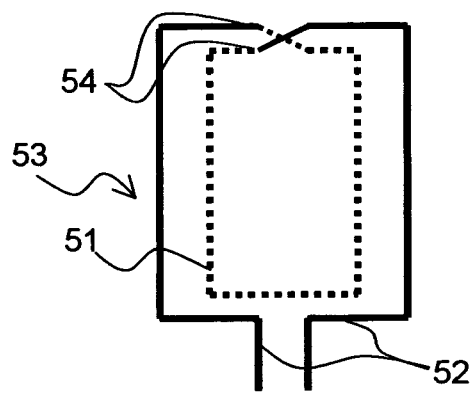
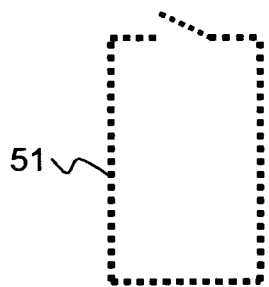
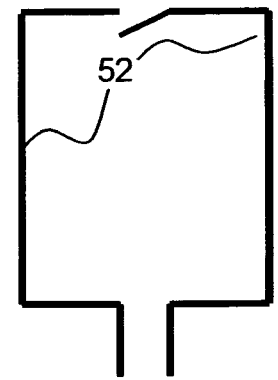
Fig. 5a    Fig. 5b    Fig. 5c
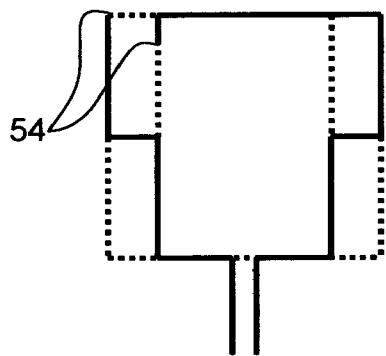
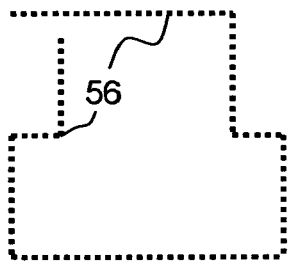
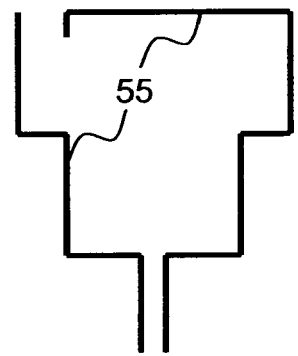
Fig. 5d    Fig. 5e    Fig. 5f
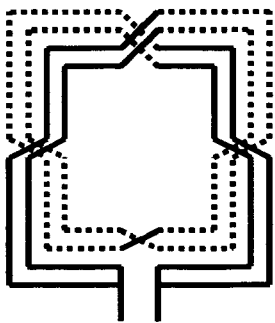
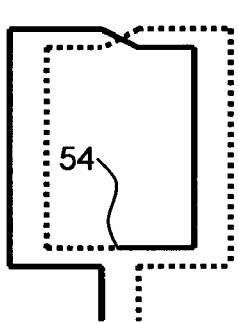
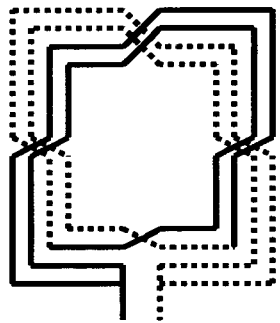
Fig. 5g    Fig. 5h    Fig. 5i ＃ ELECTRICALLY SYMMETRIC NMR COILS WITH A PLURALITY OF WINDINGS CONNECTED IN SERIES This application claims Paris Convention priority of DE 10 2005 047 883.2 filed Oct. 6, 2005 the complete disclosure of which is hereby incorporated by reference.

BACKGROUND OF THE INVENTION

The invention concerns a nuclear magnetic resonance coil probe head comprising at least two coil/resonator configurations A1 and A2, wherein at least one of the coil/resonator configurations A1 has two saddle-shaped coils S1 and S2, wherein each coil has one window which is surrounded by N windings connected in series, wherein $N \geq 2$, wherein the coil/resonator configurations A1 and A2 are aligned perpendicularly to each other, and wherein the coil/resonator configurations A1 and A2 have different resonance frequencies.

A probe head of this type is disclosed in U.S. Pat. No. 6,175,237 and the references cited therein.

U.S. Pat. No. 4,739,269 discloses an imaging NMR apparatus which comprises a transmitting coil designed as a volume coil and a receiver coil designed as planar surface coil. In order to prevent input of disturbing signals from outside of the measuring volume, the receiver coil is symmetrized. The receiver coil has two series-connected windings.

U.S. Pat. No. 6,201,392 B1 describes an NMR probe with several pairs of planar coils, at least one of them being an HTS coil pair. The respective first coils of each pair are oriented coplanar to each other, and the respective second coils of each pair are oriented coplanar to each other, wherein coupling of the coil pairs is minimized.

Nuclear magnetic resonance (NMR) spectroscopy is one of the most powerful methods of instrumental analysis. Electromagnetic pulses are thereby irradiated into a sample which is exposed to a static magnetic field. The sample emits a characteristic electromagnetic response based on the properties of the nuclei in the sample.

An NMR probe head usually has one or two preferred measuring frequencies which are used for detection. Further measuring frequencies are mainly used for transmitting decoupling pulses. These either eliminate interactions between the nuclei to be observed and the other nuclei in the surroundings thereof, or are used for "inverted experiments" which examine the effect of decoupling nuclei with a low gyromagnetic relationship $\gamma$ in the spectrum of a nucleus with a high $\gamma$ (in particular $^1H$).

Two nested coil configurations are generally used to permit simultaneous operation at several measuring frequencies. At least one of the detection measuring frequencies is thereby placed on the inner coil configuration and one tries to minimize the loss of these coil configurations. This optimizes the sensitivity of the probe head during detection.

A coil configuration typically consists of two coils which are usually connected in parallel or in series using feed lines. Coil configurations which are not galvanically or capacitively coupled to each other or consist of only one coil can also be realized. Complicated coil configurations are formed from a plurality of coils. Each coil may comprise several windings which are enclosing a window, and may be designed as one path or several parallel paths extending along the width over the entire length or at any partial sections thereof, and be interrupted along the length by capacitances and feed line connections.

The windings of the coils may be connected in series or in parallel. With multi-winding coil configurations, one distinguishes between parallel-parallel coil configurations, parallel-series coil configurations, series-series coil configurations and series-parallel coil configurations. The first term characterizes the wiring of the windings within a coil, and the second term characterizes the wiring of the two coils of the coil configuration.

Series-series coil configurations have previously mainly been used in NMR (see e.g. U.S. Pat. No. 4,398,149). These have a relatively high inductance, such that the lossy inductances of the feed lines and the additional inductances which are used in the tuning circuit of multi-frequency probe heads can be neglected in the overall coil configuration. This renders the coils highly efficient. However, the eigenresonances of the multi-winding series-series coil configurations are too low for high field NMR (static field $B_0 > 7T$) due to the high inductances. This produces poor RF field homogeneities and makes tuning of the measuring frequencies for e.g. $^{13}C$ and $^{31}P$ difficult. This problem can be solved by the reduced inductance of multi-winding series-parallel coils (see e.g. U.S. Pat. No. 6,175,237). Very large measuring samples that are used e.g. in MRI (magnetic resonance imaging) may require use of single-winding coils or parallel-parallel coils (see e.g. U.S. Pat. No. 6,060,882). In this case, the inductances of the feed lines and the circuit may, however, increase considerably faster than those of the coil configuration.

In addition to Helmholtz and saddle coils, further coil types are used in NMR such as e.g. solenoid, butterfly and meanderline coils and planar coils of the most different shapes.

Alternatively, resonator configurations may be used in the probe head which may consist of one or more resonators. So-called Birdcages, Alderman-Grant resonators or transmission line (slotted tube) resonators and also planar, self-resonant structures such as e.g. spiral resonators are frequently used in NMR.

Combinations of coil and resonator configurations are often used to build an NMR probe head for more than one operating frequency. This may be realized e.g. by positioning a first coil or resonator configuration concentrically in a second coil or resonator configuration, and aligning both such that the RF magnetic fields produced thereby are largely orthogonal to each other.

One important aim of all coil and resonator configurations is to minimize coupling between the coil/resonator configurations. Unless otherwise explicitly stated, the coil configuration and the resonator configuration are treated equally below, since the observations are equivalent for both.

A coupling between the at least two coil configurations is undesirable for many reasons:

1. In case of resonance, current flows from one coil configuration to the other through coupling. The currents of the "inner" coil configuration are thereby removed from the measuring sample, the efficiency of the configuration is reduced and thereby also the sensitivity of the probe head at that/those measuring frequency/frequencies that resonate in the inner coil configuration.
2. If a coil configuration has a considerably higher Q value than another one, residual coupling produces strong attenuation of the coil configuration with the higher Q value. This occurs, in particular, when e.g. superconducting materials are used in one coil configuration, with the other using normal conductors.
3. When the coupling between the coil configurations can be neglected, each coil configuration can be separately tuned to the at least one measuring frequency. This simplifies construction of the probe head as well as the tuning process when the sample is changed during operation.

4. When the coupling can be neglected, no cross talk can be measured between the measuring channels. This facilitates e.g. decoupling experiments.

In particular, for conventional multi-winding series-parallel coil systems as described in U.S. Pat. No. 6,175,237 and the references cited therein, coupling of two coil systems (coil configurations) can be minimized, but not be eliminated.

It is therefore the underlying purpose of the invention to provide an NMR probe head, wherein coupling between two coil/resonator configurations is further reduced.

SUMMARY OF THE INVENTION

This object is achieved in accordance with the invention by an NMR probe head of the above-mentioned type which is characterized in that each coil S1 and S2 is mirror-symmetrical relative to a central plane of the respective coil which is perpendicular to the window of the respective coil, and wherein the central planes of the coils S1 and S2 are identical to minimize electromagnetic coupling between the two coil/resonator configurations A1 and A2 at the resonance frequency of A2.

Mirror-symmetrical in this case means that any point on the conductor of the coil has a point on the conductor arranged mirror-symmetrically thereto, wherein in particular, the path lengths between a point on the conductor as well as its mirror point to any point of intersection between the coil and the central plane (in particular to any crossing point on the central plane) are equal. A coil is regarded as being mirror-symmetrical even when the geometry is symmetrical and is merely interrupted at crossing points of conductor sections or through slight parallel or radial displacements. The latter could be produced e.g. through use of two conductor layers which are disposed on different sides of a substrate.

The mirror symmetries are precisely assessed in accordance with the invention for planar coils which consist of several conductor planes and having a plane separation which is much smaller (in particular, at least factor 5 to 10 or better factor 100) than the dimensions of the coil in these conductor planes, such that the overall conductor is regarded as being disposed in the same plane. Asymmetries which are produced through the use of several conductor planes per se or a transition between a conductor section and another plane, are neglected in accordance with the invention. For saddle-shaped coils which consist of several "conductor planes", the assessment is equivalent to the planar coils when the separation between the cylinder-jacket shaped conductor surfaces is much smaller than the coil dimensions.

The two coil/resonator configurations are regarded in accordance with the invention as being oriented perpendicularly relative to each other, when they are oriented at an angle of 90°+/−5°. Coupling between the two coil/resonator configurations at these angular ranges is particularly small. An angle as close as possible to 90° is preferred. The angle between two coil/resonator configurations relates to the angle between the RF magnetic fields generated by the coils during operation.

As will be explained in more detail below, the coupling between a symmetrical coil S1, S2 and a further coil configuration A2 can be largely eliminated under certain conditions. An inventive coil configuration A1 designed in accordance with the invention influences another coil system A2 much less than conventional coil configurations.

In one particularly preferred embodiment of the inventive nuclear magnetic resonance probe head, the coils S1, S2 each have at least N−1 crossing points between conductor sections, wherein these crossing points are disposed on the central plane of the respective coil. This is a simple way to form an electrically symmetrical coil. Two conductor sections overlap at one crossing point without producing an electric contact between these conductor sections. A conductor section is an electrically conducting section of a coil.

Two or more crossing points thereby mean that a conductor section crosses two or more further conductor sections.

One further embodiment is also preferred, wherein the coil S1 and/or S2 comprises 2*J additional crossing points of conductor sections, wherein the additional crossing points are disposed in pairs, symmetric with respect to the respective central plane, with J being greater than or equal to 1. This geometry reduces the magnetic coupling of a coil configuration at higher resonant modes.

The crossings of conductor sections may be realized at any desired angle between 0° and 180°. At an angle of 90°, the crossing point is limited to the conductor width. The smaller or larger the angle, the more the crossing point widens. In the extreme case, the crossing point may assume the full extent of the coil. Both extremes are illustrated in FIG. 5*d*: a crossing at 0° at the top and a crossing at 180° on the sides. A crossing at 90° produces a minimum capacitance at the crossing point and therefore the maximum eigenresonance for a given coil geometry, which is shown e.g. in FIG. 1*a*. A crossing at 0° produces minimum dimensions which is desired, in particular, in the z direction. A crossing at 180° produces maximum RF field homogeneity in the xy plane.

In a preferred embodiment, the coils S1, S2 are formed such that the potential is distributed on the respective coil S1, S2 in a mirror-symmetrical but opposite manner relative to the respective central plane during resonant operation of the coil.

In an advantageous embodiment of an inventive nuclear magnetic resonance probe head, the coil S1 and/or S2 is designed as a wire coil. In this case, crossing points can be produced by bending a wire, and the crossing points require no particular connecting technique.

In an advantageous alternative embodiment, the coil S1 and/or S2 is designed as a sheet or thin film coil. This greatly facilitates automated production. In a sheet coil, the conductor is processed from a metal sheet (through cutting, etching etc.) and disposed onto a substrate (through gluing, pressing, melting etc.). In a thin film coil, the metallization is disposed directly onto the substrate (e.g. through evaporation, sputtering, galvanically etc.).

In a preferred further development of this embodiment, the crossing points and/or further crossing points are designed using soldered or welded bridges to control "closing" of the coil at the crossing point through varying the thickness of the projection.

In another preferred further development of the above-mentioned embodiment, the coil S1 and/or S2 is designed as a sheet coil from a planar or flexible PCB (printed circuit board) material. This facilitates production. The dielectric of the PCB material may be produced from plastic material, ceramic, glass, semiconductor, oxides, nitrides etc. The metallization can be disposed through gluing, melting, vaporization, sputtering, galvanically etc.

In an embodiment of this further development, the coil S1 and/or S2 is designed from at least N coil sections which are disposed at different planes, wherein at least N−1 through-contacts are provided through the dielectric which each electrically connects two coil sections. The through-contacts are a particularly simple way of connecting conductor sections at different levels.

In another preferred embodiment, the through-contact is not disposed at a crossing point in the respective coil S1 and/or S2.

In one particularly preferred embodiment of an inventive NMR probe head, the two coils S1, S2 of the coil/resonator configuration A1 are connected in parallel. This coil configuration A1 can be used as a series-parallel coil configuration in the NMR probe head, having minimum coupling to a second coil or resonator configuration A2 in the probe head. The coils of the coil configuration A1 are preferably of the same construction and disposed mirror-symmetrically, but may also have different constructions.

In a further embodiment, the second coil/resonator configuration A2 has at least one planar or saddle-shaped coil S3, wherein the coil S3 has a window which is surrounded by N windings connected in series, wherein N≧2, wherein the coil S3 has a mirror-symmetrical construction relative to a central plane of the coil S3 which is perpendicular to the window.

In one preferred embodiment of the inventive NMR probe head, the coil/resonator configuration A2 is designed as a Birdcage resonator. Birdcage resonators have proven to be useful in practice and may be particularly symmetrical (in the ideal case two electrical and one magnetic symmetries).

In one preferred embodiment of an inventive NMR probe head, the impedances at the feed lines of the coil/resonator configuration A1 are selected such that symmetric potentials are generated at the feed lines of the coil/resonator configuration A1 when the other coil/resonator configuration A2 is at resonance. In other words, symmetrical potentials are generated at the feed lines of the multi-winding coil configuration which is symmetrized in accordance with the invention when the other coil/resonator configuration (which may also be symmetrized in accordance with the invention) is operated at resonance. This requires a symmetrical structure of the feed lines at least in the region of substantial couplings between the feed lines of the outer coil configuration and the inner coil configuration.

Further advantages of the invention can be extracted from the description and the drawings. The features mentioned above and below may be used individually or collectively in arbitrary combination. The embodiments shown and described are not to be understood as exhaustive enumeration but have exemplary character for describing the invention.

The invention is shown and explained in more detail in the drawing.

BRIEF DESCRIPTION OF THE DRAWING

FIG. 3a shows a magnetic resonance probe head in accordance with prior art with non-symmetrical potential distribution of a coil configuration of a resonant Birdcage resonator;

FIG. 5a shows a coil for an inventive magnetic resonance probe head which is designed as a sheet coil on PCB material with two conductor planes, wherein the conductor sections of the two conductor planes are shown in dotted and fully drawn lines;

FIG. 5b shows the conductor section of the first conductor plane of FIG. 5a;

FIG. 5c shows the conductor sections of the second conductor plane of FIG. 5a;

FIG. 5d shows a coil for an inventive magnetic resonance probe head similar to FIG. 5a with three crossing points and two through-contacts which are not designed at the crossing points. The conductor sections of the two conductor planes are shown in dotted and fully drawn lines;

FIG. 5e shows the conductor section of the first conductor plane of FIG. 5d;

FIG. 5f shows the conductor sections of the second conductor plane of FIG. 5d;

FIG. 5g shows a first embodiment of PCB material of the coil of FIG. 4f with thirteen crossing points and five through-contacts;

FIG. 5h shows an alternative embodiment of the coil of FIG. 5a with a crossing point and one single through-contact;

FIG. 5i shows a second embodiment of the coil of FIG. 4f with thirteen crossing points and only two through-contacts.

DESCRIPTION OF THE PREFERRED EMBODIMENT

Figure 1A:
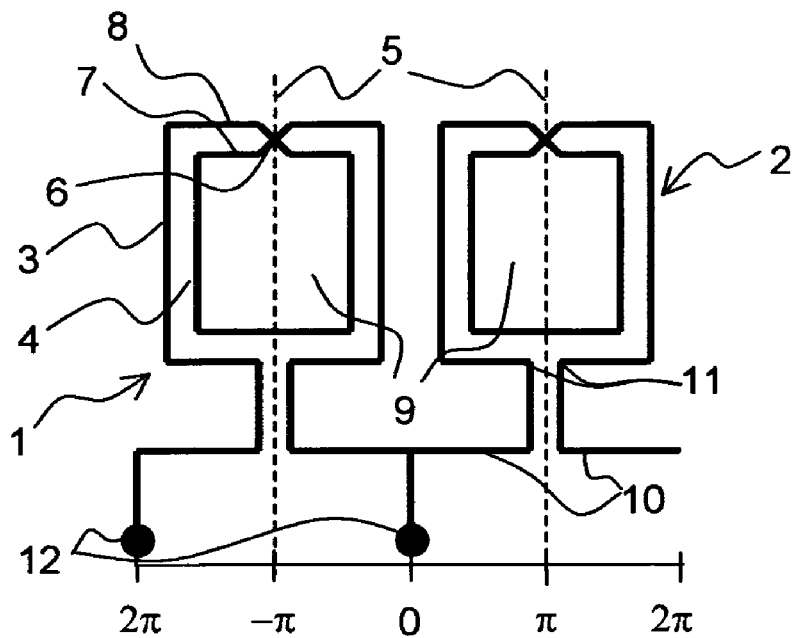
FIG. 1a shows a developed view of a coil configuration for an inventive magnetic resonance probe head, comprising two coils, each having two series windings and one crossing point and feed lines.

Saddle coils and Helmholtz coil systems have been used for a long time in nuclear magnetic resonance. A saddle coil is a coil that consists of arc-shaped transverse elements and rod-shaped longitudinal elements. It is structured such that it is placed on a cylinder jacket shaped surface (except for possible crossing points between conductor sections).

In NMR two or more measuring frequencies are usually used. One possibility to realize a magnetic resonance (MR)

probe head for more than one measuring frequency is to use two different coil configurations which are each tuned to one or more resonance frequencies. One thereby distinguishes between resonator and coil configurations. The resonators are generally selected from the group of Birdcage or Alderman-Grant resonators while the coils used are generally saddle coils. Solenoid coils are also used, in particular, in solid NMR and when flow cells are used.

Special probe heads also use planar coils and resonators. Examples thereof are probe heads for extremely mass-limited samples wherein surface coils (helices, butterfly and meanderline) are used, as well as probe heads whose detection system is cooled to cryogenic temperatures and whose resonators are produced from high-temperature superconducting material.

When two coil/resonator configurations are mounted in one probe head, they are designed in accordance with prior art such that they are mounted concentrically and have no mutual inductive coupling, since they are positioned at 90° with respect to each other. The concept of the multi-winding coils in accordance with prior art is based on the elimination of couplings between two coil/resonator configurations, when each coil configuration only has a largely magnetic symmetry.

The term electric symmetry plane in electrodynamics designates a plane that has no tangential E fields, i.e. the E fields are perpendicular to the plane. A magnetic symmetry plane, is characterized by vanishing tangential H fields, i.e. the H field is perpendicular to the magnetic symmetry plane.

For example, in the coil configuration of FIG. 1 of U.S. Pat. No. 6,175,237, the plane extending through the center of the element 30 and between the elements 16 and 26 defines a magnetic symmetry plane. The coil configuration has no further symmetry plane. Moreover, the individual coils (10, 20) are not symmetrical.

Without violating the general validity, the following is based on a magnetic resonance (MR) structure, wherein an inner coil/resonator configuration has maximum electric and magnetic symmetries. This means that this coil/resonator configuration has at least one electric and one magnetic symmetry. The third symmetry plane which should also be electrically symmetrical cannot in general be perfectly realized due to the feed lines. A second coil system shall be disposed about this inner coil configuration which is designed to prevent or at least minimize mutual coupling between the two coil configurations. Without violating the general case, mounting could be reversed, i.e. the coil configuration of interest is inside.

Minimizing the coupling between the two coil configurations has the following advantages:
1. The two coil configurations only minimally influence each other, i.e. the frequency, Q value and efficiency of the respective coil configurations are largely independent of the presence of the second coil configuration.
2. The resonance modes of the individual measuring frequencies are limited to the coil configuration to which they are coupled. This means that when a resonance is excited, no or nearly no current flows in the second coil configuration.
3. Cross-talk from one channel to the next is considerably reduced, at least when the two channels are connected to different coil configurations.
4. The circuit is simplified, since trap filters which improve cross-talk, couplings and spurious resonances can be omitted.

The couplings between the two coil configurations can be easily eliminated with single- and multi-winding parallel-parallel coils. For series-parallel and parallel-series and series-series coils, alignment yields minimization but not elimination of the coupling.

Improved elimination of the coupling in accordance with the invention

Within the scope of the present invention, it has turned out that the above-mentioned series coils have one common problem: The coils have no symmetry. This produces residual couplings between the at least two coil configurations of a probe head. The invention shows one possibility of also eliminating the residual couplings (at least largely and for certain modes). A first coil configuration which is designed in accordance with the invention with saddle-shaped coils S1, S2 has considerably less influence on a second coil configuration A2 than conventional coils.

The couplings are reduced in a design of a multi-winding series coil S1, S2, wherein the coil has a (geometrical) symmetry and has, in particular, N−1 or more crossing points between the conductor sections (N being the winding number), wherein the crossing points are either disposed on the symmetry plane or in pairs symmetrically thereto. N−1 crossing points must be on the symmetry plane, and any further crossing points must be disposed in pairs symmetrically thereto.

Figure 2:
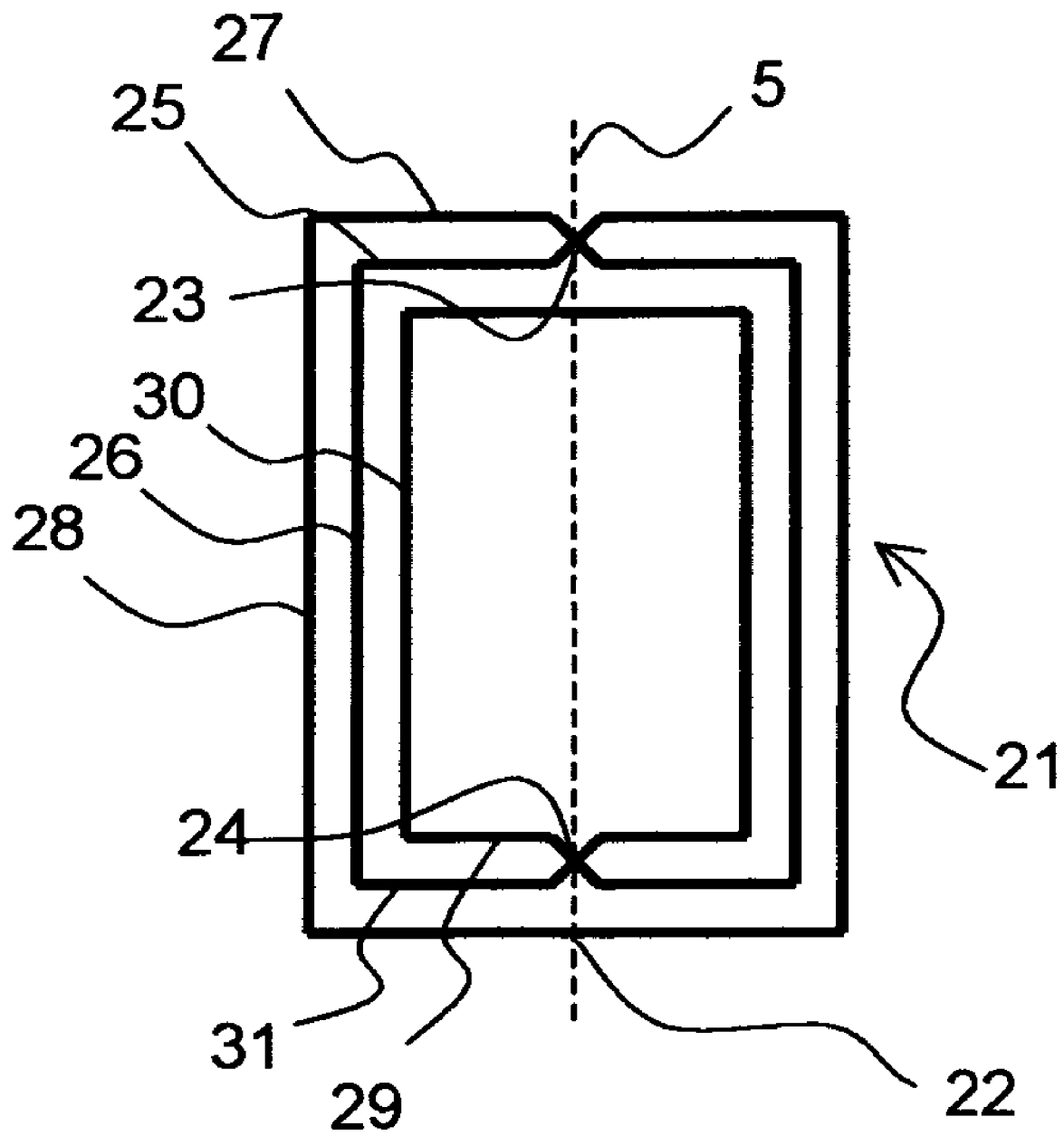
FIG. 2 shows a coil for an inventive magnetic resonance probe head with three series windings and two crossing points.

FIG. 1*a* shows this for two-winding coils and FIG. 2 for three-winding coils. The symmetry is either maintained by independently switching the two coils (e.g. through inductive coupling) or by connecting them in parallel.

FIG. 1*a* shows a developed view of a coil configuration for an inventive magnetic resonance probe head, comprising two coils S1, S2, which are also designated by reference numerals 1, 2. By means of example, the geometry of the two coils 1, 2 is illustrated for coil 1. Coil 1 has two windings 3, 4 which are connected in series. Coil 1 is mirror-symmetrical relative to a central plane 5 which is perpendicular to the plane of the drawing. A conductor section 7 of the inner winding 4 is guided to the outside at a crossing point 6, and a conductor section 8 of the outer winding 3 is guided to the inside. The conductor sections 7, 8 thereby overlap at the crossing point 6. The conductor section 7 is thereby guided over the conductor section 8 without producing an electrically conducting connection between the conductor sections 7, 8. The crossing point 6 is on the central plane 5. Of course, one of the two conductor sections 7 or 8 may remain in the coil surface and only the second is guided to the inside or outside. The inner winding 4 surrounds a window 9 of the coil 1.

Figure 1B:
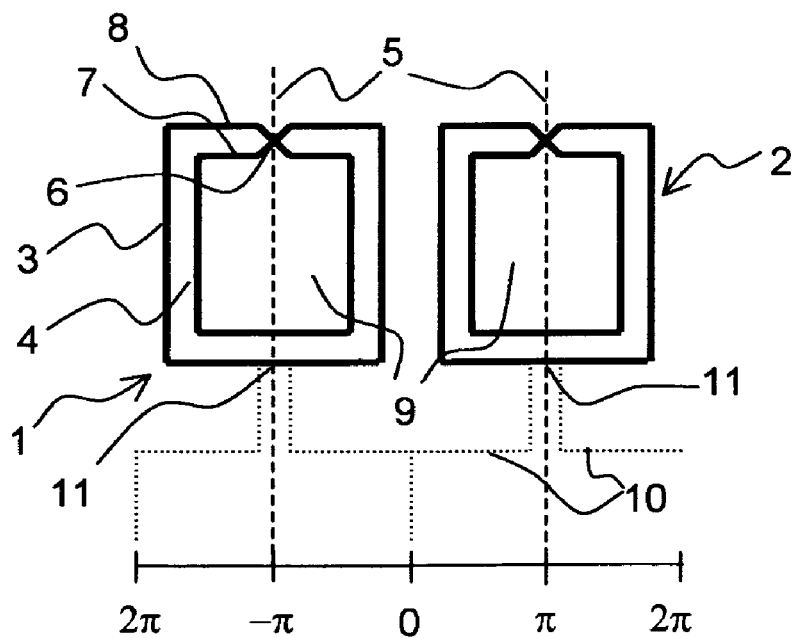
FIG. 1b shows the coil configuration of FIG. 1a, wherein the coils (fully-drawn lines) are shown before being interrupted by the connection of the feed lines (dotted lines)

FIG. 1*b* shows the coil configuration of FIG. 1*a* before being joined. The feed lines 10 are shown in dotted lines and the two coils 1, 2 are shown in solid lines. The coils 1 and 2 are not yet interrupted at the connecting points 11 of the feed lines 10.

FIG. 2 shows a coil S1, S2 for an inventive magnetic resonance probe head, namely a coil 21 which has three windings 26, 28, 30. The coil 21 has two crossing points 23, 24. A conductor section 25 of the central winding 26 and a conductor section 27 of the outer winding 28 cross at the upper crossing point 23. A conductor section 31 of the central winding 6 and a conductor section 29 of the inner winding 30 cross at the lower crossing point 24. The crossing points 23, 24 are, in turn, on a central plane 5. Point 22 is suited to interrupt the conductor, e.g. to adjust the coil 21 to resonance using a capacitor or to provide feed lines.

FIGS. 1*a*, 1*b* and 2 and the following figures show coils and coil configurations in a simplified fashion, i.e. a possibly round coil shape which forms e.g. a cylinder-jacket shaped surface, is shown in developed view. The z axis faces upwards, the x axis projects from the plane of the drawing at "0" and the y axis at "π" (see FIG. 1a, x,y,z form an orthogonal system).

Figure 3B:
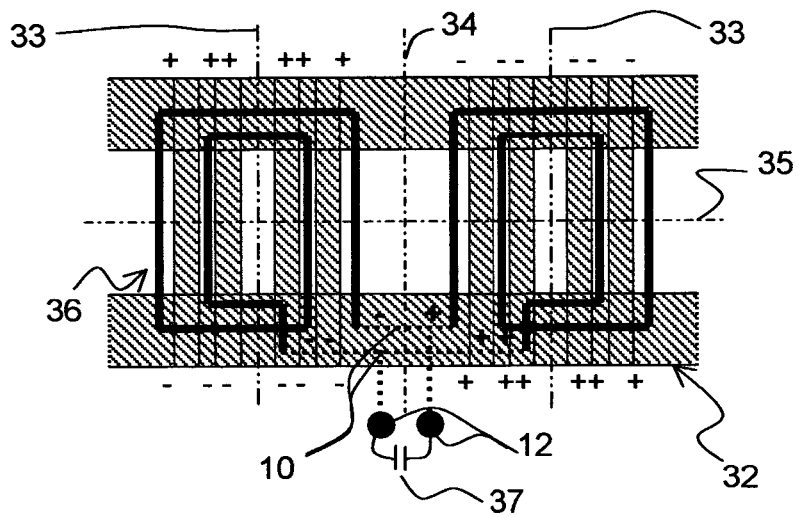
FIG. 3b shows an inventive magnetic resonance probe head with a coil configuration with symmetrical feed lines and symmetrical potential distribution of a resonant Birdcage resonator.
Figure 3B:
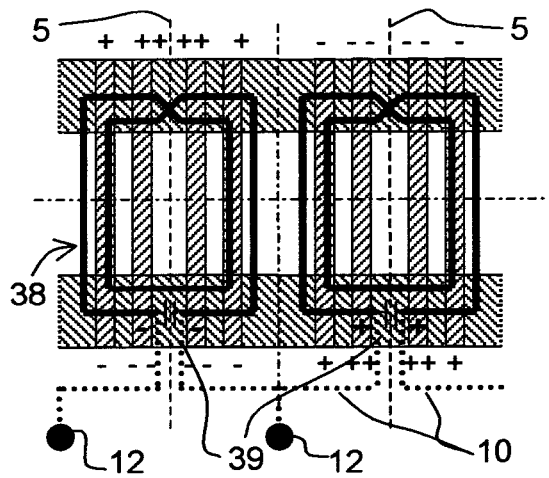
Figure 3C:
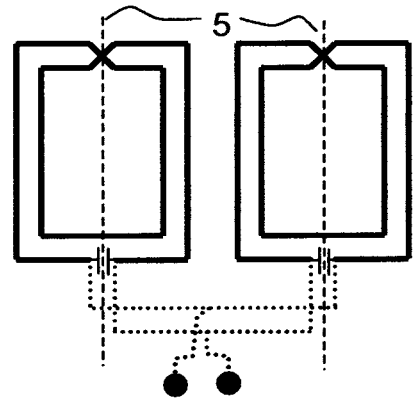
FIG. 3c shows a coil configuration for an inventive magnetic resonance probe head with symmetrically tapped but asymmetrically designed feed lines.

FIGS. 3a and 3b each show a magnetic resonance probe head, comprising an (outer) coil configuration A1 and an (inner) Birdcage (BC) resonator A2, (reference numeral 32). The coils 36, 38 of the outer coil configuration A1 are drawn with solid lines, whereas the feed lines 10 are shown in dotted lines. The BC 32 or A2 is shown in hatched lines. The BC 32 is supposed to have maximum symmetries, i.e. the yz plane is a magnetic symmetry plane 33 of the BC and the xz and xy planes are electrical symmetry planes 34 and 35 of the BC 32.

FIGS. 3a and 3b show the distribution of the potential on the inner BC resonator 32 at a time during operation. The potentials are symmetrical to the symmetry plane 33 and anti-symmetrical to the two planes 34 and 35.

In view of the potentials on the outer coil 36, 38, the potentials obtained are like those shown in FIGS. 3a and 3b (the larger the distance of the outer coils from the BC the smaller the absolute values of the potentials on the coils).

The potentials on a fully-symmetrical Birdcage merely show a representative view of the potentials which are generated by producing the RF magnetic field in space. When a field with little symmetry is generated using coil or resonator configurations, the symmetries of the fields will be correspondingly smaller.

Regarding now the potentials on the outer coil configuration A1 or 36 in accordance with prior art (FIG. 3a): Initially neglecting the generated resonances of the outer coil 36, one can assume that the potentials which are generated on the outer coils 36 during operation of the inner resonator 32 approximate those of the nearest metallic elements of the resonator 32: the more so, the smaller the separation. This results in different potentials applied at the two connecting points 12 of the two coils 36 (+ and ++ or − and −−). If each coil 36 were separately electrically closed by one capacitor each, a current would flow through this capacitor in the feed lines of each of the two outer coils 36 during operation of the inner coil system.

This potential difference between the two coils 36 of a coil configuration A1 causes the currents in the two feed lines 10 to flow in the same direction when the two coils 36 of the coil configuration are connected using feed lines 10. If the capacitor 37 is "centrally" connected in each case, no currents flow through it. If it is not "centrally" connected (FIG. 3a) part of the currents flow through the capacitor 37. The fields generated by the currents in the feed lines extend in the same direction as the fields of the inner resonator 32, i.e. the feed lines 10 highly couple inductively with the resonator. The currents which are generated in the coil configuration during operation of the inner resonator 32 in accordance with prior art, produce a plurality of undesired properties of the probe head, as mentioned above.

The connection between two coils 36 of a conventional coil configuration A1 is generally designed such that the feed lines 10 produce no magnetic field for operating the coil configuration A1. This means, if the feed lines are operated in the "differential mode", the fields generated thereby largely cancel at a distance of approximately the separation between the conductors.

At the resonance frequency of the inner coil configuration 32 or A2, the currents flow in the "common mode" on the feed lines 10. This means, the fields generated by the feed lines 10 cannot cancel and the two coil configurations A1, A2 additionally couple via the feed lines 10.

An additional voltage can also be induced in accordance with Ampere's Law through inductive coupling due to the asymmetry of the coils 36. The fact that the crossing points of the conventional coils 36 are not on the magnetic symmetry plane 32 of the inner coil system but in a region with a relatively high field gradient during operation of the BC resonator 32 produces different couplings between the inner and outer windings. The couplings cannot mutually cancel, and each individual coil 36 as well as the connected coil configuration of FIG. 3a couples inductively to the resonator 32.

A circuit is usually connected to the feed lines 10 of the coil configuration A1 of an MR probe head. As stated above, the connecting points 12 of the circuit to the feed lines 10 of conventional coils have a potential, i.e. during operation of the inner resonator 32 A2, and voltages are generated across the connecting points 12 of the circuit of the outer coil configuration A1. In practice, this coupling requires a trap filter in the connections of the circuit to decouple the individual measuring frequencies and to avoid loss due to "spurious resonances" in the tuning circuit. These trap filters produce additional loss in the resonator 32 A2 at resonance.

When the feed lines are symmetrically connected, the connecting points 12 of the circuit have no potentials. However, an annular current component flows, since less current flows in the "upper" feed line than in the "lower" feed line, i.e. in addition to the common mode, an additional current flows due to the potential difference at the connecting legs which produces unnecessary loss.

In the inventive MR probe head with coil configuration A1 designed in accordance with the invention (FIG. 3b), the connecting legs of each coil 38 have identical potentials (+, + or −, −) due to the symmetrical structure of both coils S1, S2 with reference numeral 38 of the coil configuration A1.

If the connecting points 11 of a coil 38 are closed for an RF current using a capacitor 39, there is no current flow through the capacitor 39 of the coil 38.

When the two coils 38 of the coil configuration A1 of FIG. 3b are also connected via feed lines 10, the currents in these two feed lines 10 flow in the same direction. The inventive embodiment with the two coils 38 cannot solve this problem but merely reduce it, since the potential differences between the two coils 38 are smaller than between conventional coils. Moreover, inventive coil configurations A1 have no circular current component in the feed lines due to the symmetry properties. In addition, the symmetry of the individual coils 38 eliminates exactly the inductive couplings.

When the feed lines 10 are improperly designed, they may considerably contribute to coupling between the coil/resonator configurations A1, A2 via inductive coupling as in prior art. In order to prevent coupling between the feed lines of the outer coil configuration A1 and the inner resonator A2, they must be symmetrically guided to the central plane 5 sufficiently far to the outside, such that the connection between the two coils 38 is guided out at one location in space where the resonator A2 field is already very small. Alternatively, the feed lines 10 may also be shielded.

In contrast to the conventional coils, the connecting points 12 between the circuit and the feed lines 10 of coils 38 have no potential. For this reason, lossy trap filters can be omitted. This simplifies considerably the construction and adjustment of an MR probe head and reduces the loss when the resonator A2 is at resonance.

Figure 3D:
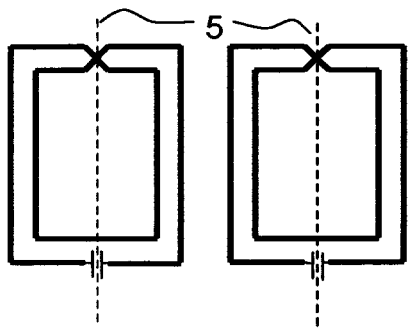
FIG. 3d shows a coil configuration for an inventive magnetic resonance probe head without feed lines for inductive coupling.
Figure 3E:
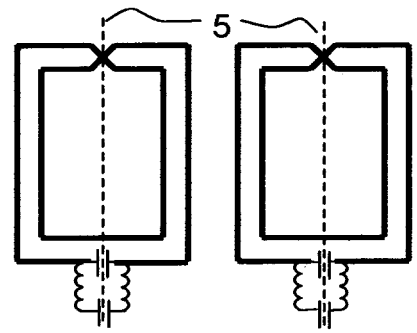
FIG. 3e shows an coil configuration for an inventive magnetic resonance probe head without feed lines for operation at two resonance frequencies.

FIGS. 3d and 3e show two coil configurations A1 which are not galvanically coupled. They may e.g. be inductively coupled. The coil configuration A1 of FIG. 3e is adjusted to two resonance frequencies using additional reactive elements. These two coil configurations without feed lines solve the problem of coupling between feed line and inner resonator A2 in an elegant fashion. Operation of the inner resonator A2 produces only small loss, since the potential differences between the two coils of the coil configuration A1 cannot be balanced through a current flow in the feed lines. The single residual couplings of these coil configurations A1 are electric couplings between a rung of the inner resonator A2 and a rung of the coil, and between an annular element of the resonator A2 and an annular element of the outer coil. These direct couplings cannot be cancelled but have no essential influence on the overall mode, since they cancel each other in a differential manner when the coil/resonator configurations are reasonably designed.

The result of the installation of a coil configuration A1 designed in accordance with the invention in an NMR probe head is that the performance of the inner resonator configuration A2 is only slightly influenced by the outer coil configuration A1. This is useful, in particular, when the inner resonator A2 has a considerably higher Q value than the outer coil configuration A1. Moreover, the frequency of the inner resonator A2 changes only slightly when an inventive coil is mounted around it. This is achieved through the negligible coupling. The remaining reduction in the Q value or frequency shift of the inner coil configuration A2 is due to the shielding effect of the outer coil configuration A1 and the above-mentioned direct couplings (rung-rung or ring-ring).

Up to now, it has been assumed that the resonances of the outer coil configuration A1 can be neglected. Only couplings via potentials were taken into consideration, which are anti-symmetrical to the symmetry plane 5. In reality, this simplification is not always allowed. The outer coil configuration A1 has a plurality of modes (eigenresonances) which may also have a symmetrical potential distribution. The couplings with these higher modes of the outer coil occur, in particular, when at least one frequency, to which the outer coil is tuned, is lower than the lowest frequency of the inner resonator A2.

These higher modes of the coils S1 and/or S2 of an inventive probe head can cause problems similar to conventional coils. The first harmonic e.g. of a two-winding coil in accordance with FIG. 1 (in case of arrangement in pairs and inductive coupling of the fourth mode, for galvanic parallel connection of the coils of the third mode, i.e. the anti Helmholtz mode of the first harmonic) can cause very strong coupling to the inner coil/resonator configuration A2, since this mode produces an effective H field perpendicular to the lowest mode of one coil S1, S2. If it is aligned perpendicularly to a second coil/resonator configuration A2, the inner configuration A2 couples inductively to the first harmonic of the inventive coil configuration A1.

Figure 4A:
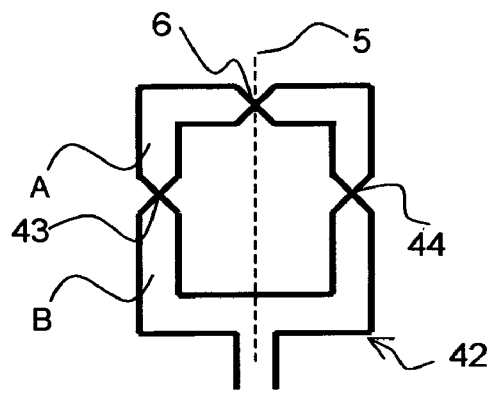
FIG. 4a shows a coil for an inventive magnetic resonance probe head with two series windings and three crossing points.

In contrast to conventional coils, this magnetic coupling of the coils S1 and/or S2, reference numeral 42 can be reduced by inserting two (or more) additional crossing points 43, 44 (FIG. 4*a*). These are suitably disposed such that the coupling between the two coil/resonator configurations A1, A2 through surfaces A are equal and opposite to those through surfaces B for the decoupling mode. If further modes shall be decoupled, additional crossing points can be inserted. In this fashion, the coil configuration A1 greatly reduces the couplings between the basic modes of two coil configurations A1, A2 and also largely eliminates couplings to higher modes.

In this connection, FIG. 4*a* shows a coil (S1 and/or S2) 42 for an inventive MR probe head, having two series windings. It has a crossing point 6 on the central plane 5 and two further crossing points 43, 44 which are disposed mirror-symmetrically relative to the central plane 5. These further crossing points 43, 44 cause coupling of the flows through regions A and B, opposite to the harmonic. This cancels the magnetic coupling. Decoupling of the fundamental mode is thereby not influenced.

Note: The coil S1, S2 for an inventive MR probe head is based on a different principle than the Doty Litz coil (U.S. Pat. No. 6,060,882). The latter utilizes crossing points to obtain identical currents in all parallel paths of a multi-winding parallel coil. The design principle is equalizing inductances of the individual paths. The electric symmetry may also be maintained in a parallel coil. The principle of crossings of the inventive coil is to obtain an electric symmetry in a series coil using crossing points (6, 23, 24), which none of the conventional series-type coils has, and to reduce or prevent inductive couplings of higher modes using additional crossing points (43, 44).

A combination of series and parallel coils as shown e.g. in U.S. Pat. No. 6,060,882 is also possible: one or more series windings can be divided into two or more parallel paths, wherein any additional crossing points can be inserted between the parallel paths as disclosed in U.S. Pat. No. 6,060,882.

Figure 4B:
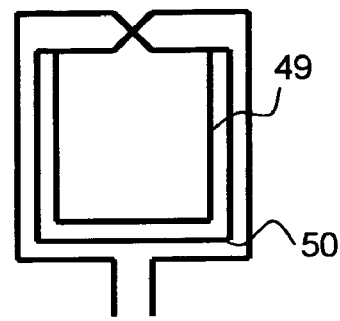
FIG. 4b shows a coil for an inventive magnetic resonance probe head with two series windings which partially consists of two parallel-connected conductor paths.

FIG. 4*b* shows a two-winding coil for an inventive MR probe head, wherein the inner winding is divided into two parallel paths 49 and 50.

Figure 4C:
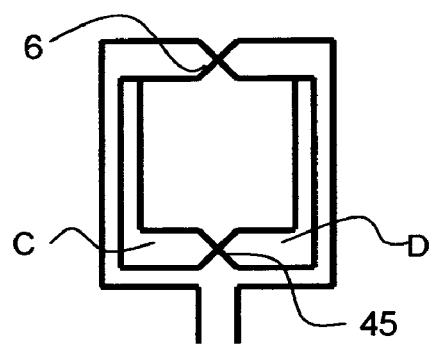
FIG. 4c shows a coil for an inventive magnetic resonance probe head with two series windings, the inner winding consisting of two parallel paths which cross on the central plane.

In FIG. 4*c*, an additional crossing point 45 is inserted on the symmetry plane, where the parallel paths cross to obtain largely identical currents in the parallel paths. The surfaces C and D should thereby have the same size which is automatically achieved by the symmetry. It should be noted that the crossing point 6 ensures the symmetry of the coil, whereas the crossing point 45 homogenizes the currents in the parallel paths.

Figure 4D:
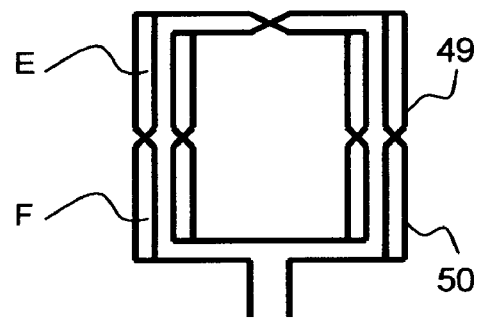
FIG. 4d shows a coil for an inventive magnetic resonance probe head with two series windings, wherein the "rungs" are designed as two crossed parallel paths.

FIG. 4*d* shows a two-winding series coil, wherein the "rungs" are designed as two parallel rungs. The four additional crossing points largely keep the currents in the rungs identical. Towards this end, the magnetic flux through the surfaces E and F should be identical during operation of the coil.

Figure 4E:
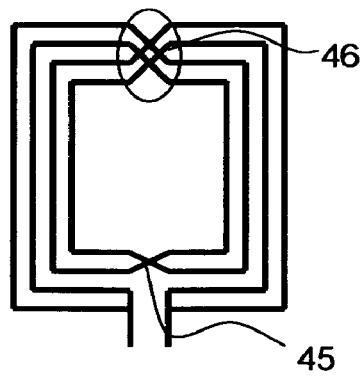
FIG. 4e shows a coil for an inventive magnetic resonance probe head, namely a two-winding series coil, wherein the conductor is designed in the form of two parallel paths over the entire length.

FIG. 4*e* shows a two-winding series coil, wherein two parallel paths are provided over the full length of the conductor. The crossing point 45 thereby homogenizes the currents between the parallel windings, the four crossing points 46 provide electrical symmetry. This coil has already an overall of 5 crossing points.

Figure 4F:
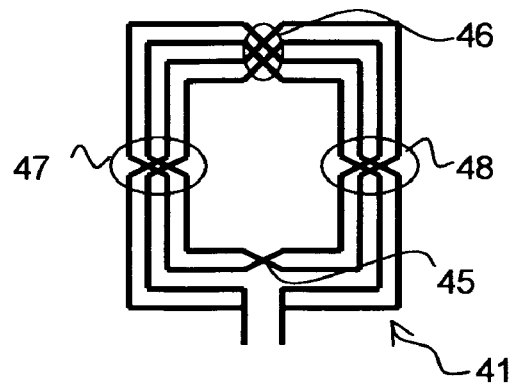
FIG. 4f shows a coil for an inventive magnetic resonance probe head, namely a two-winding series coil, wherein the conductor is designed in the form of two parallel paths over the entire length and 13 crossing points are provided between the conductors.

FIG. 4*f* finally shows a two-winding series coil which has two parallel paths over the entire length of the conductor, with further crossing regions 47 and 48 being inserted compared to the coil of FIG. 4*e* in order to reduce inductive couplings with higher modes. This coil has a total of 13 crossing points.

Embodiments of coils or coil configurations:
1. wire coil
    advantage: the crossing points can be produced through bending, no connecting technology for crossing points is required.
2. sheet/thin film coil, crossing points via bridges (soldered/welded)
    advantage: simple production using automated processes.
3. sheet coils of flexible PCB material, crossing points through connection through the dielectric, either between layers on both sides or using a bridge as in the second case.
    Advantage: When flexible PCBs are used which are coated on both sides with conductor material, the coil can be designed such that even when several crossing points are provided, only one single through-contact is required in the ideal case. The through-contact can thereby be separated from the crossing points.

FIGS. 5*a* through 5*c* show the structure of a sheet coil (S1 and/or S2) of an coil configuration A1 for an inventive MR probe head. A first conductor section 51 is disposed on a first side of the sheet, and two further conductor sections 52 are disposed on a second side of the sheet. In the finished coil 53 (FIG. 5a), the two conductor sections 51, 52 are connected via two through-contacts 54 through the dielectric sheet.

FIGS. 5d through 5f show a coil S1 and/or S2 with three crossing points and two through-contacts. This embodiment is preferred compared to the coil of FIG. 5a in that it has a minimum size in the z direction. The overlappings of the coil windings at the crossing points and the transverse connections may moreover be designed such that the capacitance formed thereby already tunes the coil to a measuring frequency. When the capacitance between the conductor sections 55 and 56 at the upper end of the coil is large enough, the through-contacts may be completely omitted.

FIG. 5g shows an embodiment on a PCB material of the coil of FIG. 4f. The coil of FIG. 5g has only six through-contacts although it has thirteen crossing points.

FIG. 5h shows an alternative embodiment of the coil of FIG. 5a: The feed lines are connected to different sides of the PCB material such that only one single through-contact 54 which needs not be at a crossing point is sufficient.

FIG. 5i demonstrates the strength of this method: The coil of FIG. 5i merely has two through-contacts while having thirteen crossing points. When the thickness of the dielectric compared to the dimensions is large, the required symmetry in the electrical fields is excessively influenced when this method is applied. This results in a reduction of the possible improvement over a conventional coil. In this case, it is reasonable to provide several through-contacts to restore the symmetry.

Clearly, all actually produced crossing points slightly violate the symmetry of the coil. This slight asymmetry, however, produces only a negligible additional coupling between the two coil systems A1, A2. Such a slight violation of the symmetry at the crossing points should therefore be neglected in accordance with the invention. The additional coupling, if at all, is of rather inductive nature and can be reduced through suitable positioning of the bridges. Electrical asymmetry is thereby provided only locally but not globally as in the case of conventional coils. For this reason, it produces no considerable couplings.

A multi-winding coil having voltage dividers integrated along the conductor length (either an integrated capacitance or a discrete "chip" capacitor may thereby be used) or having integrated capacitors to form a simple "resonator" for tuning the coil to a certain frequency is also in accordance with the invention. When the coil has been tuned to one or more resonance frequencies by integrated capacitors, the feed lines are no longer absolutely necessary. The coil can now also be inductively coupled via the feed lines instead of galvanic or capacitive coupling.

The inventive coil configurations can form nuclear magnetic resonance probe heads with two or more coil/resonator configurations A1, A2, of which at least one is a multi-winding series-parallel coil configuration with minimum mutual coupling.

List of Reference Numerals 1. coil
2. coil
3. winding
4. winding
5. central plane
6. crossing point
7. conductor section
8. conductor section
9. window
10. feed lines
11. connecting point of the feed lines
12. connecting point of the circuit
21. coil
22. connecting point of the feed lines
23. crossing point
24. crossing point
25. conductor section
26. central winding
27. conductor section
28. outer winding
29. conductor section
30. inner winding
31. conductor section
32. Birdcage
33. H symmetry BC
34. E symmetry BC
35. E symmetry BC
36. coil
37. capacitor
38. coil
39. capacitor
41. coil
42. coil
43. crossing point
44. crossing point
45. crossing point
46. crossing points
47. crossing points
48. crossing points
49. crossing points
50. parallel path
51. conductor section
52. conductor sections
53. coil
54. through-contacts
55. conductor sections
56. conductor section

We claim:

1. An NMR probe head, comprising:
   at least two coil/resonator configurations A1 and A2, wherein at least one of the coil/resonator configurations A1 comprises two saddle-shaped coils S1 and S2, wherein each coil S1 and S2 has one single window about which N windings, connected in series, are disposed, wherein N≧2 the coil/resonator configurations A1 and A2 being aligned perpendicularly to each other and having different resonance frequencies, wherein each coil S1 and S2 is mirror-symmetric relative to a central plane of a respective coil, said central plane being perpendicular to said window of said respective coil, wherein central planes of said coils S1 and S2 are identical to minimize electromagnetic coupling between said two coil/resonator configurations A1 and A2 at a resonance frequency or coil/resonator configuration A2.

2. The NMR probe head of claim 1, wherein each coil S1, S2 has at least N−1 crossing points between conductor sections thereof, wherein said crossing points are disposed on said central plane of said respective coil.

3. The NMR probe head of claim 2, wherein at least one of the coils S1, S2 has 2*J further crossing points between said conductor sections, wherein said further crossing points are disposed in pairs, symmetrically with respect to said respective central plane, wherein J≧1.

4. The NMR probe head of claim 3, wherein at least one of the coils S1, S2 is a sheet or a thin film coil, said crossing points or said further crossing points being formed using soldered or welded bridges.

5. The NMR probe head of claim 1, wherein said coils S1, S2 are formed such that, during resonant operation thereof, a potential on said respective coil S1, S2 is distributed mirror-symmetrically, but equal and opposite, relative to said respective central plane.

6. The NMR probe head of claim 1, wherein at least one of the coils S1, S2 is a wire coil.

7. The NMR probe head of claim 1, wherein at least one of the coils S1, S2 is a sheet or thin film coil.

8. The NMR probe head of claim 7, wherein at least one of the coils S1, S2 is designed as a sheet coil of flexible PCB (printed circuit board) material.

9. The NMR probe head of claim 8, at least one of the coils S1, S2 is formed from at least N coil sections which are disposed on different planes, with at least N−1 through-contacts being provided through a dielectric, each electrically connecting two coil sections.

10. The NMR probe head of claim 9, wherein one through-contact is not disposed on a crossing point in said respective coil S1, S2.

11. The NMR probe head of claim 1, wherein said two coils S1, S2 of said coil/resonator configuration A1 are connected in parallel.

12. The NMR probe head of claim 1, wherein said second coil/resonator configuration A2 comprises at least one planar or saddle-shaped coil S3, said coil S3 having a window about which N windings, connected in series, are disposed, wherein N≧2, said coil S3 being mirror-symmetric relative to a central plane thereof which is perpendicular to said window.

13. The NMR probe head of claim 1, wherein said coil/resonator configuration A2 is a Birdcage resonator.

14. The NMR probe head of claim 1, wherein impedances at feed lines of said coil/resonator configuration A1 are selected such that, at a resonance frequency of said coil/resonator configuration A2, symmetric potentials form at said feed lines of said coil/resonator configuration A1.

* * * * *